(12) United States Patent
Li et al.

(10) Patent No.: US 9,788,442 B2
(45) Date of Patent: Oct. 10, 2017

(54) HOUSING LOCKING APPARATUS

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Zan Li, Wuhan (CN); Liang-Chin Wang, New Taipei (TW); Yu-Ming Xiao, Wuhan (CN); Shou-Rui Qin, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 437 days.

(21) Appl. No.: 14/523,544

(22) Filed: Oct. 24, 2014

(65) Prior Publication Data

US 2016/0113133 A1    Apr. 21, 2016

(30) Foreign Application Priority Data

Oct. 17, 2014    (CN) .......................... 2014 1 0551033

(51) Int. Cl.
*E05C 3/06*      (2006.01)
*H05K 5/02*      (2006.01)
(Continued)

(52) U.S. Cl.
CPC ......... *H05K 5/0221* (2013.01); *E05B 65/006* (2013.01); *G06F 1/18* (2013.01);
(Continued)

(58) Field of Classification Search
CPC ................. E05B 65/006; Y10S 292/31; Y10T 292/0886; Y10T 292/0889; Y10T 292/1043; Y10T 292/1051; Y10T 292/108
(Continued)

(56) References Cited

U.S. PATENT DOCUMENTS 2,649,322 A  *  8/1953  Mack ....................... E05C 1/145
                                                             292/173
4,343,501 A  *  8/1982  Meeks .................... E05B 85/12
                                                             292/113
(Continued)

*Primary Examiner* — Carlos Lugo
(74) *Attorney, Agent, or Firm* — Steven Reiss

(57) ABSTRACT

A housing locking apparatus includes a shell, a cover, a fixing member, a blocking member and an operation member. The shell includes an abutting portion protruding inside of the shell and a restriction member protruding outside of the shell. The cover includes a covering plate and a sidewall protruding from the covering plate. The sidewall defines a restriction hole and abuts against the outside of the shell. The restriction member is movably received in the restriction hole. The fixing member is attached to the covering plate. The blocking member and the operation member are both rotationally attached to the fixing member. An end of the blocking member abuts against the abutting portion. The operation member rotates around the fixing member at a first direction to press the blocking member to rotate to position the end of the blocking member between the covering plate and the abutting portion.

14 Claims, 9 Drawing Sheets

(51) Int. Cl.
*G06F 1/18* (2006.01)
*E05B 65/00* (2006.01)
*E05C 3/00* (2006.01)

(52) U.S. Cl.
CPC ............. *G06F 1/181* (2013.01); *Y10S 292/31* (2013.01); *Y10T 292/0886* (2015.04); *Y10T 292/0889* (2015.04); *Y10T 292/108* (2015.04); *Y10T 292/1043* (2015.04); *Y10T 292/1051* (2015.04)

(58) Field of Classification Search
USPC ............................ 312/223.1, 223.2; 292/200
See application file for complete search history.

(56) References Cited

U.S. PATENT DOCUMENTS

| | | | | |
|---|---|---|---|---|
| 4,626,007 A * | 12/1986 | Larson | ................ | E05B 19/0005 292/65 |
| 4,813,722 A * | 3/1989 | Viscome | ................ | B60N 2/366 292/216 |
| 4,834,433 A * | 5/1989 | Keller | ..................... | E05B 85/18 16/DIG. 24 |
| 5,292,159 A * | 3/1994 | Sandhu | ............... | E05B 15/1635 292/173 |
| 5,630,630 A * | 5/1997 | Price | ................... | E05B 17/2003 292/128 |
| 6,152,501 A * | 11/2000 | Magi | ........................ | E05B 5/00 292/169 |
| 6,373,692 B1 * | 4/2002 | Cheng | .................... | G06F 1/181 220/4.02 |
| 6,474,703 B1 * | 11/2002 | Berg | ........................ | E05C 1/145 292/200 |
| 6,719,332 B2 * | 4/2004 | Sekulovic | ............... | E05C 3/162 292/165 |
| 6,721,183 B1 * | 4/2004 | Chen | ....................... | G06F 1/181 16/404 |
| 7,052,053 B2 * | 5/2006 | Hall | ........................ | E05C 3/162 292/126 |
| 7,252,351 B2 * | 8/2007 | Chen | ....................... | G06F 1/181 312/223.2 |
| 7,399,009 B2 * | 7/2008 | Hall | ........................ | E05B 63/20 292/100 |
| 7,798,540 B1 * | 9/2010 | Vitry | ........................ | E05B 5/00 292/216 |
| 8,911,034 B2 * | 12/2014 | Kuo | .......................... | G06F 1/18 312/223.2 |
| 9,422,749 B2 * | 8/2016 | Lu | ............................ | B25H 3/02 |
| 9,575,518 B2 * | 2/2017 | Geng | ....................... | G06F 1/182 |
| 2008/0036218 A1 * | 2/2008 | Liang | ...................... | E05B 5/003 292/336.3 |
| 2014/0028164 A1 * | 1/2014 | Chen | ....................... | G06F 1/181 312/223.2 |

* cited by examiner

HOUSING LOCKING APPARATUS

CROSS-REFERENCE TO RELATED APPLICATIONS

This application claims priority to Chinese Patent Application No. 201410551033.5, filed on Oct. 17, 2014, the contents of which are incorporated by reference herein.

FIELD

The present disclosure relates to a housing locking apparatus.

BACKGROUND

Electronic devices, for example, computer towers, include a shell and a cover attached to the shell. The cover is generally attached to the shell by screws. When assembling or disassembling the electronic device, an accessory tool is needed.

BRIEF DESCRIPTION OF THE DRAWINGS

Implementations of the present technology will now be described, by way of example only, with reference to the attached figures.

DETAILED DESCRIPTION

Figure 1:
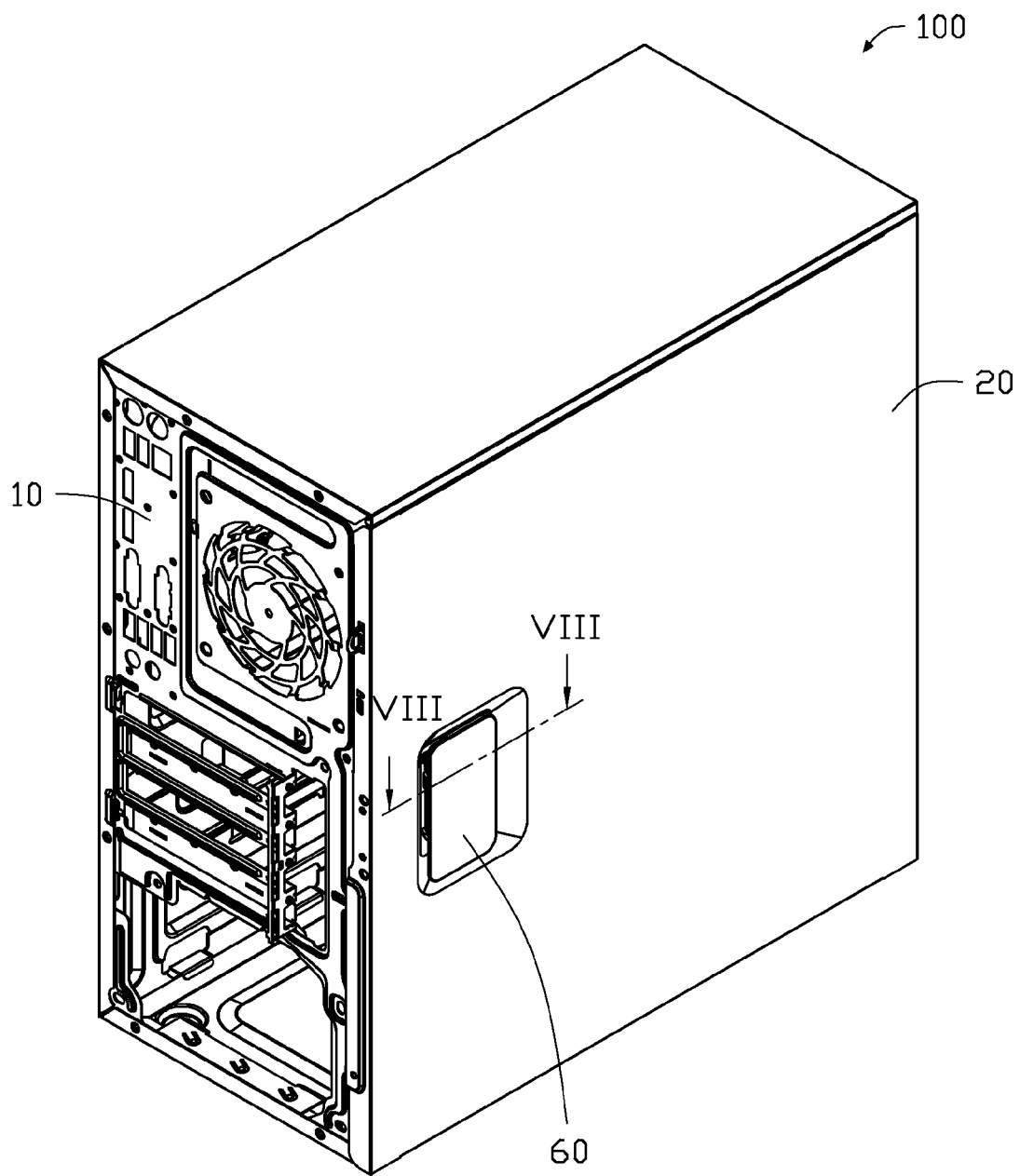
FIG. 1 is an isometric view of a housing locking apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
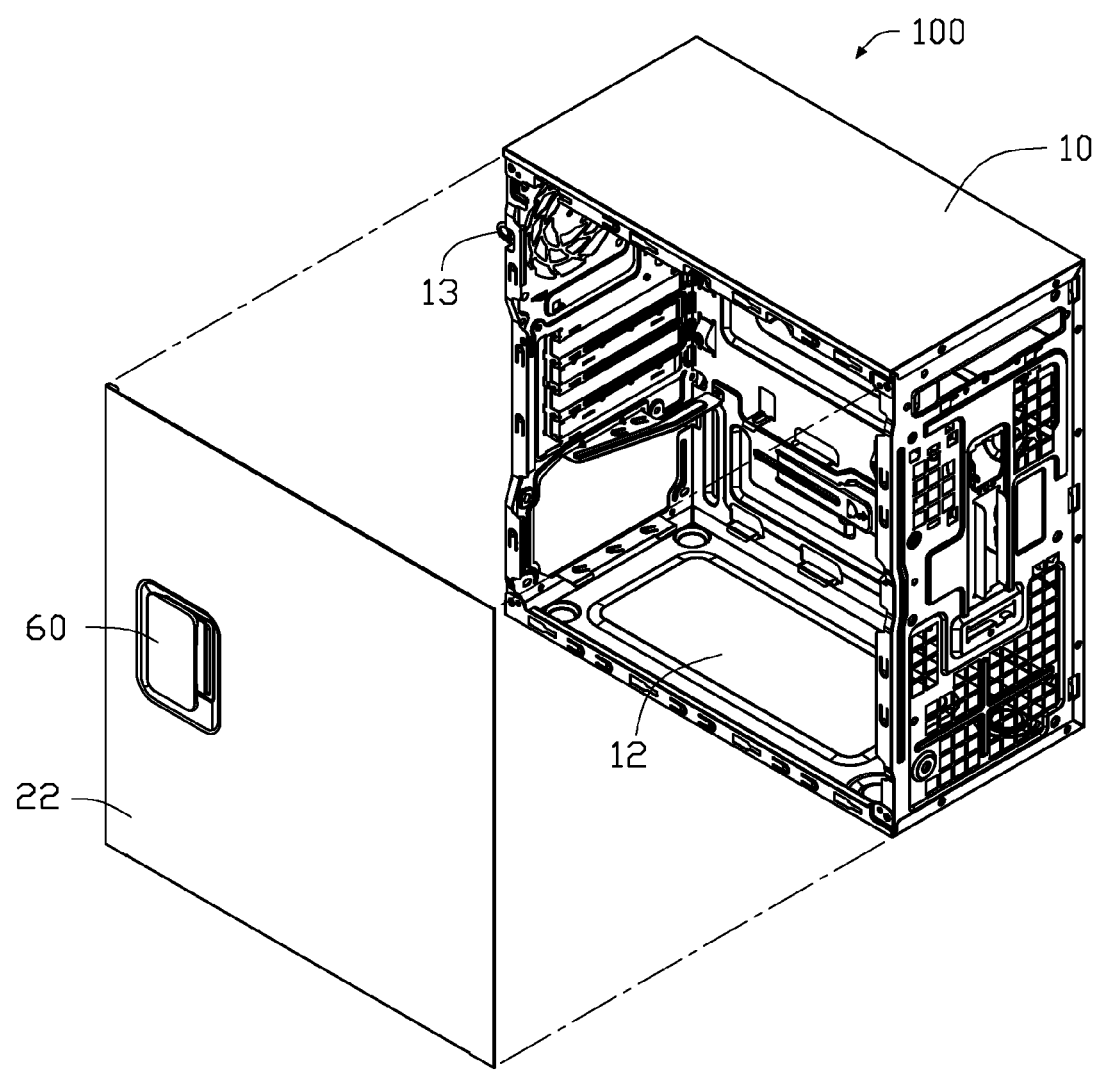
FIG. 2 is an exploded isometric view of a part of the housing locking apparatus in FIG. 1.
Figure 3:
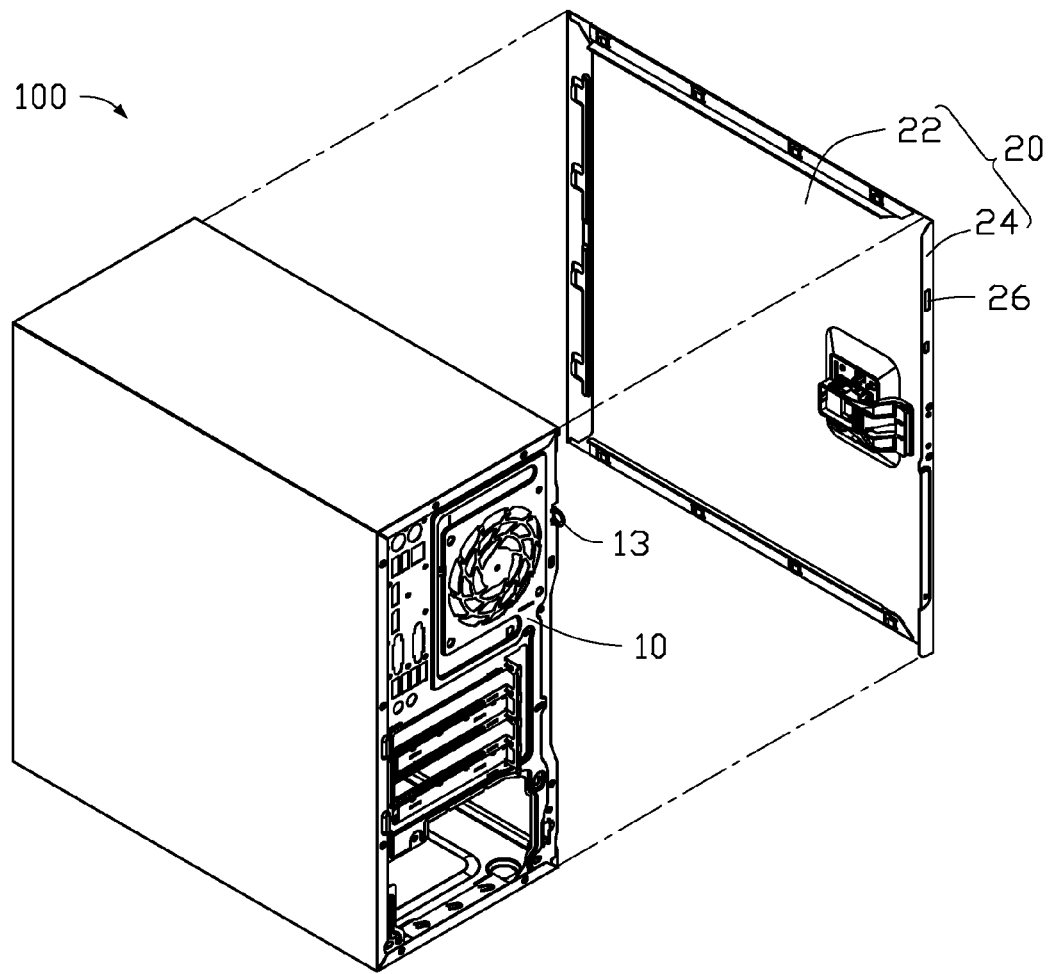
FIG. 3 is similar to FIG. 2, but viewed from another angle.
Figure 4:
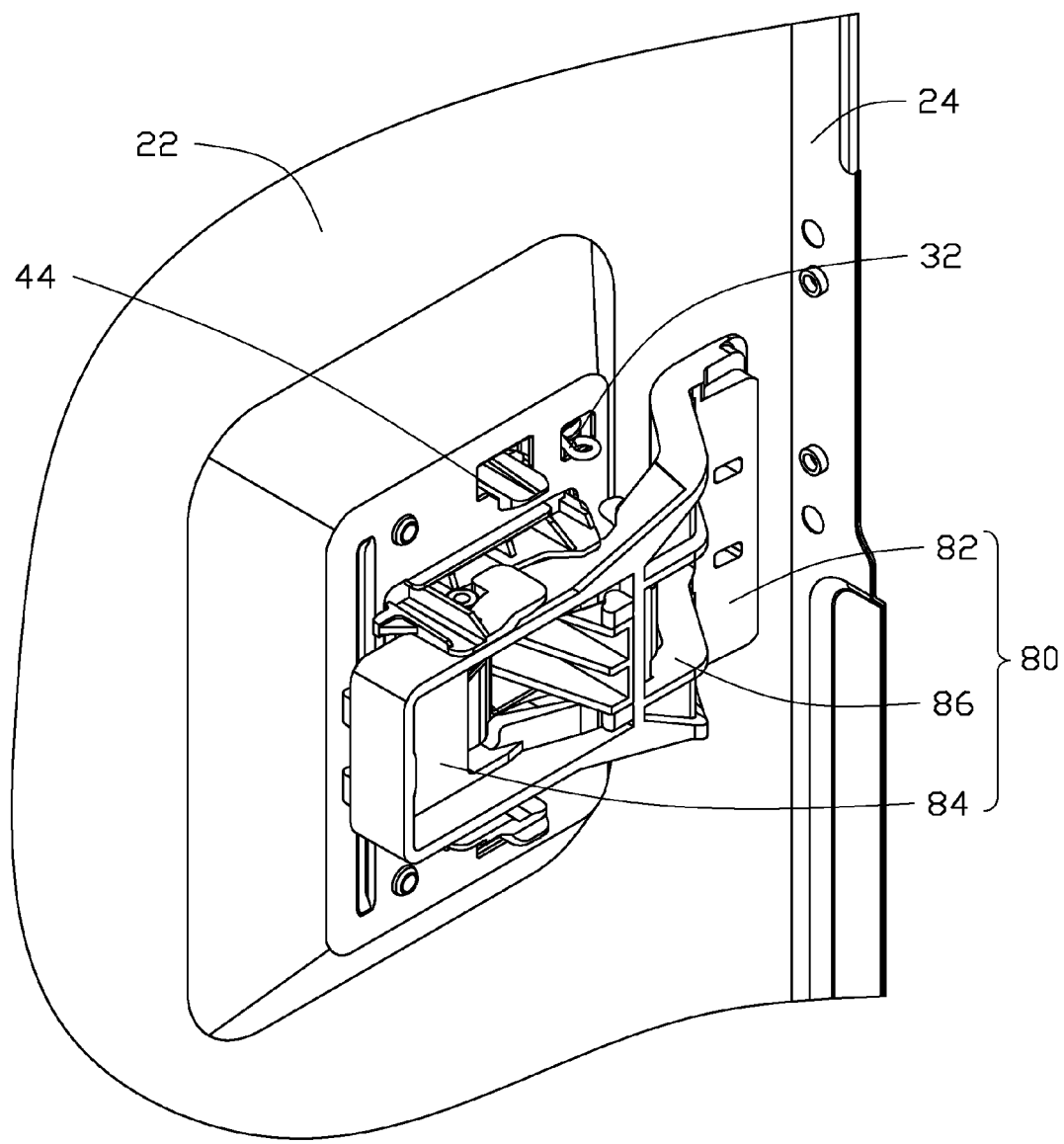
FIG. 4 is an enlarged isometric view of a part of the housing locking apparatus in FIG. 3.
Figure 5:
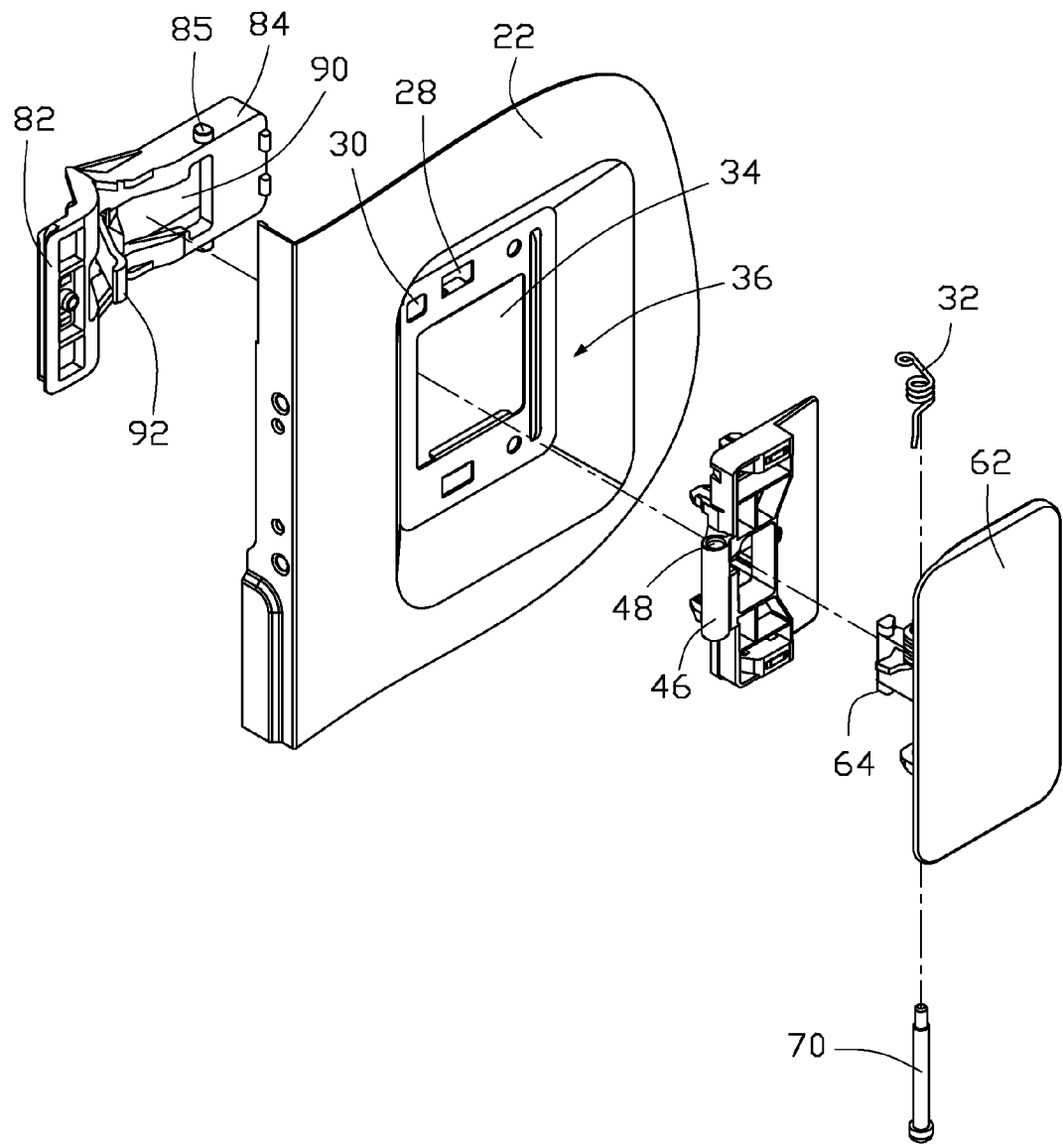
FIG. 5 is an exploded isometric view of the housing locking apparatus in FIG. 4.

FIGS. 1 and 2 illustrate a housing locking apparatus 100 including a shell 10 and a cover 20. The shell 10 defines an opening 12. The cover 20 includes a covering plate 22 and a sidewall 24 protrudes from an edge of the covering plate 22. The covering plate 22 is received in the opening 12 to shield the opening 12. The sidewall 24 abuts against an external surface of the shell 10 and defines a restriction hole 26. The shell 10 includes a restriction member 13 toward the restriction hole 26. The restriction member 13 is movably received in the restriction hole 26.

FIGS. 3 to 6 illustrate that the housing locking apparatus 100 further includes a fixing member 40, an operation member 60 and a blocking member 80. The fixing member 40 is attached to the cover 22. The operation member 60 is rotationally attached to the fixing member 40. The blocking member 80 is arranged inside of the cover 22 and is rotationally attached to the fixing member 40. The blocking member 80 includes a blocking portion 82 opposite to the sidewall 24. Also referring to FIG. 7, the shell 10 includes an abutting portion 14 protruding from inside of the shell 10 and spaced from the covering plate 22. An extension direction of the abutting portion 14 is parallel to an axis of the restriction hole 26. The blocking portion 82 faces the sidewall 24 and abuts against the abutting portion 14.

Figure 8:
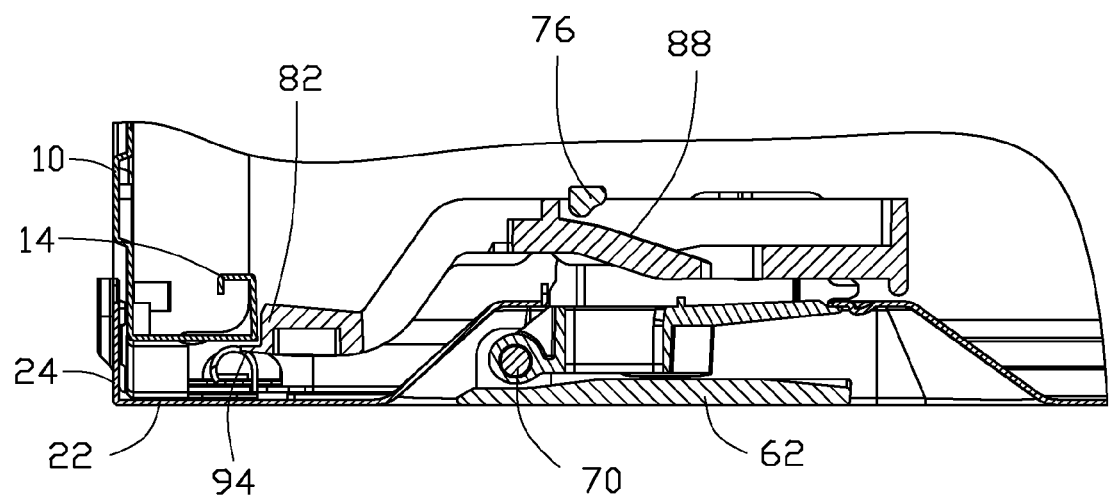
FIG. 8 is a cross-sectional view taken along the line VIII-VIII of FIG. 1, with a shell locked to the cover.
Figure 9:
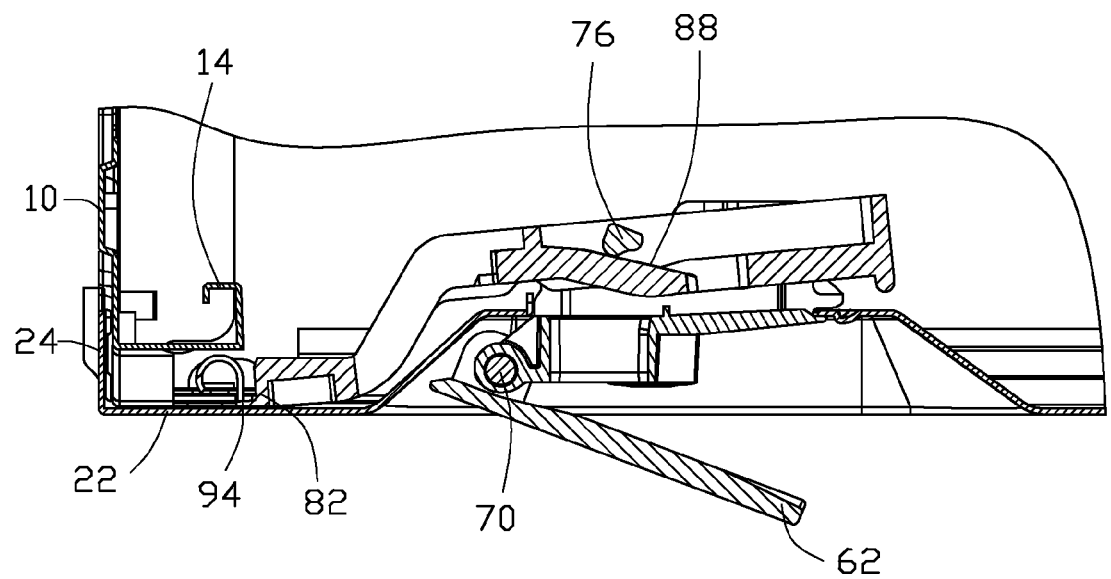
FIG. 9 is a cross-sectional view taken along the line VIII-VIII of FIG. 1, with a shell unlocked to the cover.

FIGS. 8 and 9 illustrate that the operation member 60 includes an operation portion 62 and a pressing portion 64. The operation portion 62 is arranged outside of the covering plate 22. The pressing portion 64 is arranged inside of the covering plate 22. The pressing portion 64 is configured to press the blocking member 80 when rotating around the fixing member 40 at a first direction then rotating around the blocking member 40 at a reverse direction until the blocking portion 82 is positioned between the abutting portion 14 and the cover 20. Thus, the blocking portion 82 is unblocked by the abutting portion 14 along an axial direction of the restriction hole 26. The covering plate 22 can be pushed toward the sidewall 24 along the axial direction of the restriction hole 26 until the restriction member 13 is moved out of the restriction hole 26 to disassemble the cover from the shell 10.

Figure 6:
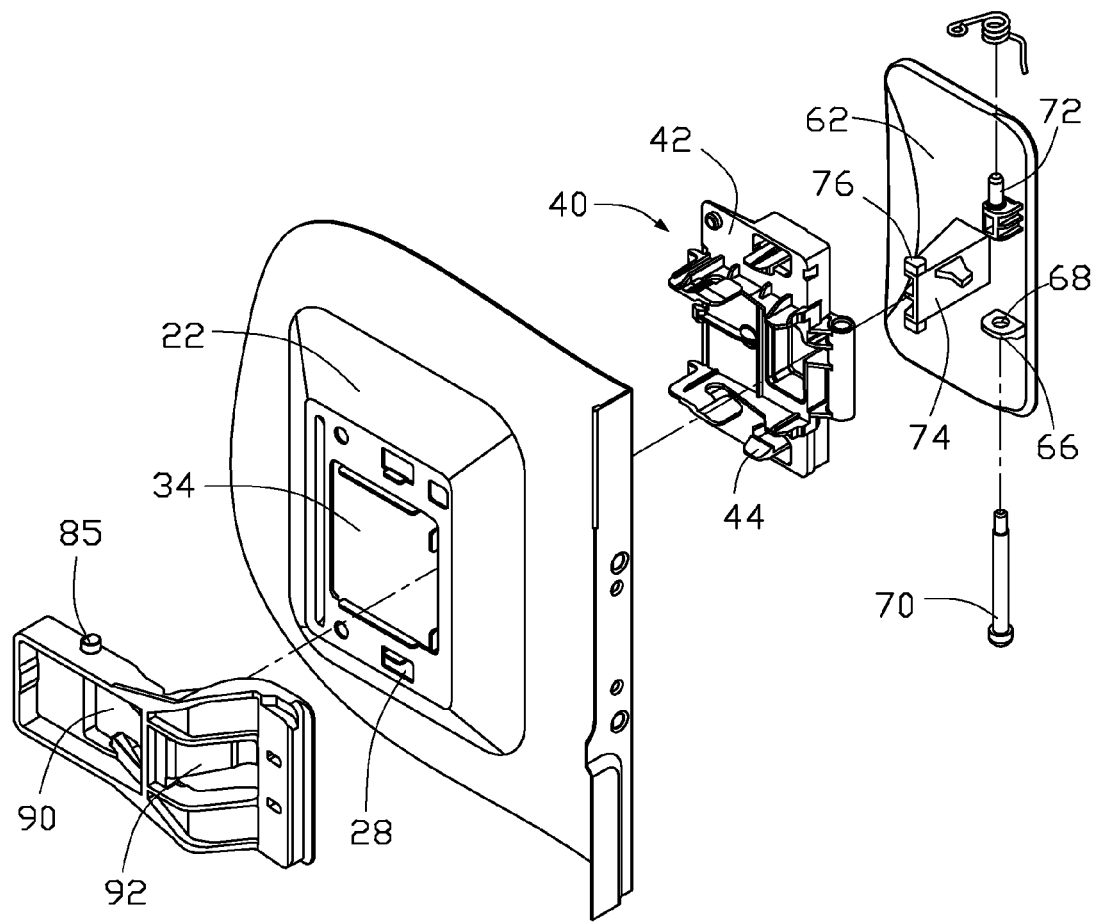
FIG. 6 is similar to FIG. 5, but viewed from another angle.
Figure 7:
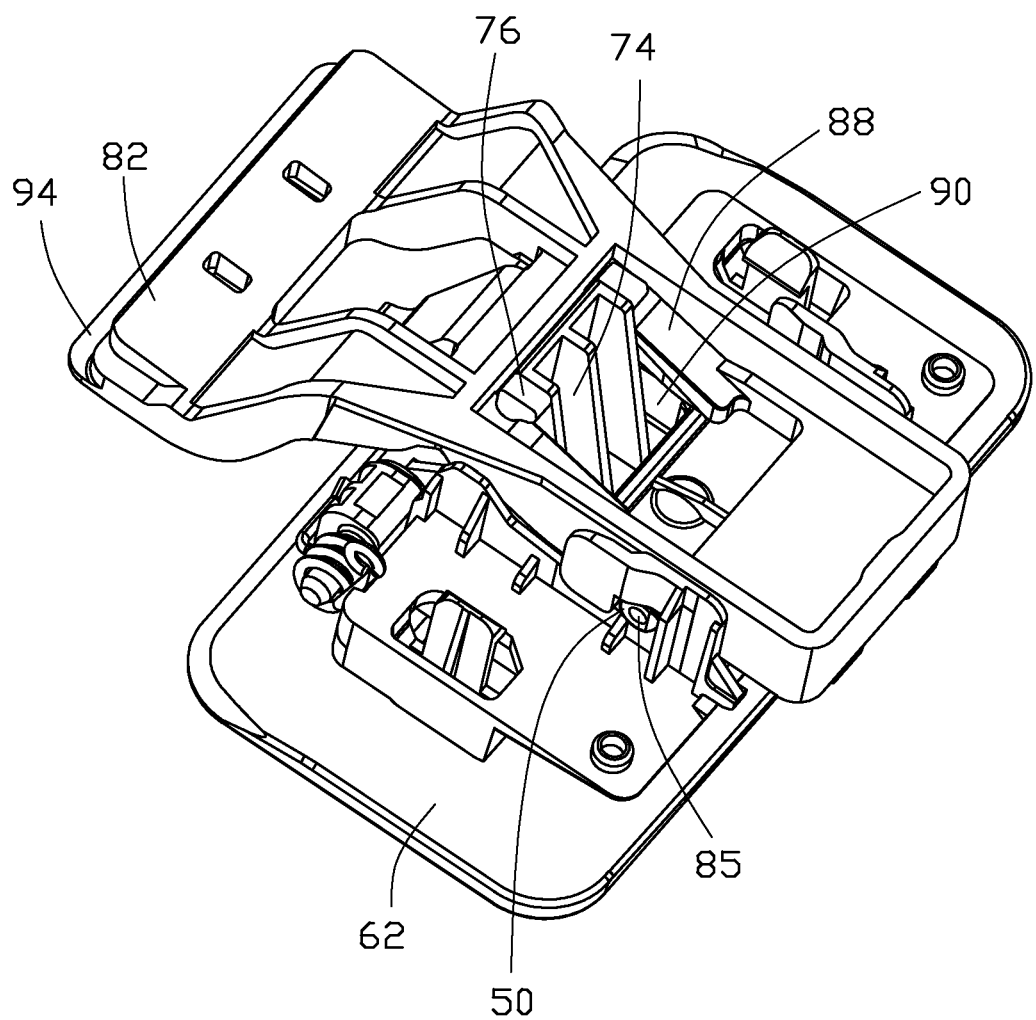
FIG. 7 is similar to FIG. 4, but with a cover omitted.

Also referring to FIG. 6, the covering plate 22 defines a number of first through holes 28. The fixing member 40 includes a pedestal 42 and a number of clasping members 44. The pedestal 42 is arranged outside of the covering plate 22. The clasping members 44 pass through the first through holes 28 to clasp to an inside of the covering plate 22. A shaft sleeve 46 is attached to a side of the pedestal 42 and defines a first shaft hole 48. The operation portion 62 includes two protruding ears 66 opposite to each other. Each protruding ear 66 defines a connection hole 68. The shaft sleeve 46 is arranged between the two protruding ears 66. A first rotation shaft 70 is rotationally received in the first shaft hole 48 and the two connection holes 68. A fixing shaft 72 protrudes from an end of one of the two protruding ears 66 away from the other protruding ear 66. The covering plate 22 further defines a receiving hole 30. An elastic member 32 is sleeved on the fixing shaft 72 and abuts the receiving hole 30. When the operation portion 62 is pressed to rotate around the first rotation shaft 70 at the first direction, the elastic member 32 is deformed. When the operation portion 62 is released, the elastic member 32 provides an elastic force to reset the operation portion 62. The elastic member 32 can be a torsion spring.

The cover 20 defines a second through hole 34. Also referring to FIGS. 4 and 5, the blocking member 80 further includes a rotation portion 84 and a connection portion 86. The rotation portion 84 and the blocking portion 82 extend substantially parallel from two ends of the connection portion 82. A second rotation shaft 85 protrudes from an external surface of the rotation portion 84. The pedestal 42 further defines a second shaft hole 50. The second rotation shaft 85 is rotationally received in the second shaft hole 50. The rotation portion 84 includes two slant rails 88. A third through hole 90 communicating with the second through hole 34 is defined between the two slant rails 88. The pressing portion 64 includes a supporting portion 74 protruding from the operation portion 62 and two protrusions 76 protruding from two sides of an end of the supporting portion 74 away from the operation portion 62. The two protrusions 76 pass through the first through hole 70 and the second through hole 34 to be arranged above the two slant rails 88. The third through hole 90 is positioned between the first rotation shaft 70 and the second rotation shaft 85. The first rotation shaft 70 is closer to the sidewall 24 than the second rotation shaft 85. Therefore, when the operation portion 62 rotates around the first rotation shaft 70 away from the covering plate 22, the two protrusions 76 press the two slant rails 88 to push the blocking portion 82 to rotate the second rotation shaft 85 toward the covering plate 22. Thus, the blocking portion 82 can be positioned between the abutting portion 14 and the cover 20.

The blocking member 80 further includes an elastic arm attached to the rotation portion 84 and extending toward the blocking portion 82. The elastic arm 92 abuts against an inner surface of the covering plate 22. When the blocking portion 82 rotates around the second rotation shaft 85 toward the covering plate 22, the elastic arm 92 is deformed. An elastic force is provided by the elastic arm 92 to reset the blocking member 80 when the blocking portion 82 stops rotating around the second rotation shaft 85 toward the covering plate 22. The blocking member 80 further includes a stopping portion 94 extending from the blocking portion 82 toward the sidewall 24. The stopping portion 94 is positioned below the abutting portion 14. The stopping portion 94 is configured to hook the abutting portion 14 when the blocking portion 80 resets.

A part of the covering plate 22 is sunken to form a receiving space 36. The operation portion 62 and the pedestal 42 are received in the receiving space 36. Thus, the covering plate 22 and the operation member 60 are perceived as being plane.

The embodiments shown and described above are only examples. Even though numerous characteristics and advantages of the present technology have been set forth in the foregoing description, together with details of the structure and function of the present disclosure, the disclosure is illustrative only, and changes may be made in the details, including in matters of shape, size and arrangement of the parts within the principles of the present disclosure up to, and including, the full extent established by the broad general meaning of the terms used in the claims.

What is claimed is:

1. A housing locking apparatus to lock a cover to a shell, comprising:

the shell defining an opening and comprising an abutting portion protruding from inside of the shell;

the cover comprising a covering plate spaced from the abutting portion and a sidewall protruding from an edge of the covering plate, the covering plate received in the opening to shield the opening and the sidewall abutting against outside of the shell;

a fixing member attached to the covering plate;

a blocking member rotationally attached to the fixing member, an end of the blocking member facing the sidewall and abutting against the abutting portion; and an operation member rotationally attached to the fixing member, the operation member configured to rotate around the fixing member at a first direction to press the blocking member to rotate to position the end of the blocking member between the covering plate and the abutting portion;

wherein the covering plate defines a plurality of first through holes, the fixing member comprises a pedestal and a plurality of clasping members, the pedestal is arranged outside of the covering plate, the clasping members pass through the first through holes to clasp inside of the covering plate, the fixing member comprises a shaft sleeve defining a first shaft hole, the operation portion comprises two protruding ears opposite to each other, each protruding ear defines a connection hole, the shaft sleeve is arranged between the two protruding ears, a first rotation shaft is rotationally received in the first shaft hole and the two connection holes, an end of one of the two protruding ears protrudes a fixing shaft away from the other protruding ear, the covering plate further defines a receiving hole, and an elastic member sleeves on the fixing shaft and abuts the receiving hole.

2. The housing locking apparatus as claimed in claim 1, wherein a second rotation shaft protrudes from an external surface of the blocking member, the fixing member further defines a second shaft hole, the second rotation shaft is rotationally received in the second shaft hole.

3. The housing locking apparatus as claimed in claim 2, wherein the first rotation shaft is closer to the sidewall than the second rotation shaft, the blocking member defines a through hole between the first rotation shaft and the second rotation shaft, a part of the operation member passes through the through hole to be positioned above the through hole.

4. The housing locking apparatus as claimed in claim 3, wherein the blocking member comprises two rails, the through hole is arranged between the two rails, the operation member comprises two protrusions positioned above the two rails, the two protrusions press the blocking member when the operation member rotates around the fixing member at the first direction.

5. The housing locking apparatus as claimed in claim 4, wherein the rails are slant rails.

6. The housing locking apparatus as claimed in claim 2, wherein the blocking member further comprises an elastic arm arranged between the second rotation shaft and the end of the blocking member, the elastic arm abuts against an inner surface of the covering plate, the elastic arm provides an elastic force to reset the blocking member.

7. The housing locking apparatus as claimed in claim 1, wherein the blocking member further comprises a stopping portion extending from the end of the blocking member toward the sidewall, the stopping portion is positioned below the abutting portion and is configured to hook the abutting portion.

8. A housing locking apparatus to lock a cover to a shell, comprising:
the shell comprising an abutting portion protruding inside of the shell and a restriction member protruding from outside of the shell;
the cover comprising a covering plate spaced from the abutting portion and a sidewall protruding from an edge of the covering plate, the sidewall defining a restriction hole and abutting against outside of the shell, the restriction member movably received in the restriction hole;
a fixing member attached to the covering plate;
a blocking member rotationally attached to the fixing member, an end of the blocking member facing the sidewall and abutting against the abutting portion; and
an operation member rotationally attached to the fixing member, the operation member configured to rotate around the fixing member at a first direction to press the blocking member to rotate to position the end of the blocking member between the covering plate and the abutting portion, wherein the restriction member can be moved out from the restriction hole, the covering plate defines a plurality of first through holes, the fixing member comprises a pedestal and a plurality of clasping members, the pedestal is arranged outside of the covering plate, the clasping members pass through the first through holes to clasp inside of the covering plate, the fixing member comprises a shaft sleeve defining a first shaft hole, the operation portion comprises two protruding ears opposite to each other, each protruding ear defines a connection hole, the shaft sleeve is arranged between the two protruding ears, a first rotation shaft is rotationally received in the first shaft hole and the two connection holes, an end of one of the two protruding ears protrudes a fixing shaft away from the other protruding ear, the covering plate further defines a receiving hole, and an elastic member sleeves on the fixing shaft and abuts the receiving hole.

9. The housing locking apparatus as claimed in claim 8, wherein a second rotation shaft protrudes from an external surface of the blocking member, the fixing member further defines a second shaft hole, the second rotation shaft is rotationally received in the second shaft hole.

10. The housing locking apparatus as claimed in claim 9, wherein the first rotation shaft is closer to the sidewall than the second rotation shaft, the blocking member defines a through hole between the first rotation shaft and the second rotation shaft, a part of the operation member passes through the through hole to be positioned above the through hole.

11. The housing locking apparatus as claimed in claim 10, wherein the blocking member comprises two rails, the through hole is arranged between the two rails, the operation member comprises two protrusions positioned above the two rails, the two protrusions press the blocking member when the operation member rotates around the fixing member at the first direction.

12. The housing locking apparatus as claimed in claim 11, wherein the rails are slant rails.

13. The housing locking apparatus as claimed in claim 9, wherein the blocking member further comprises an elastic arm arranged between the second rotation shaft and the end of the blocking member, the elastic arm abuts against an inner surface of the covering plate, the elastic arm provides an elastic force to reset the blocking member.

14. The housing locking apparatus as claimed in claim 8, wherein the blocking member further comprises a stopping portion extending from the end of the blocking member toward the sidewall, the stopping portion is positioned below the abutting portion and is configured to hook the abutting portion.

* * * * *